United States Patent [19]

Vlasak

[11] Patent Number: 4,628,273
[45] Date of Patent: Dec. 9, 1986

[54] OPTICAL AMPLIFIER

[75] Inventor: Weldon R. H. Vlasak, Van Nuys, Calif.

[73] Assignee: International Telephone and Telegraph Corporation, New York, N.Y.

[21] Appl. No.: 560,631

[22] Filed: Dec. 12, 1983

[51] Int. Cl.[4] .................. H01S 3/00; G02B 6/14; H01J 43/04
[52] U.S. Cl. ..................... 330/4.3; 350/96.1; 313/532
[58] Field of Search ............... 330/4.3, 138, 294, 277, 330/56, 310; 250/207, 213 R, 214 A; 313/103 CM, 528, 532, 537; 350/96.1, 96.14

[56] References Cited

U.S. PATENT DOCUMENTS

| 2,163,700 | 6/1939 | Ploke et al. | 313/532 |
|---|---|---|---|
| 2,594,740 | 4/1952 | DeForest et al. | 250/213 |
| 3,465,159 | 9/1969 | Stern | 330/4.3 |
| 3,478,213 | 11/1969 | Simon et al. | 250/207 |
| 3,560,750 | 2/1971 | Kodaira-shi | 250/199 |
| 3,760,216 | 9/1973 | Lasser et al. | 313/103 |
| 3,770,966 | 11/1973 | Sagawa et al. | 250/205 |
| 3,828,231 | 8/1974 | Yamamoto | 330/4.3 |
| 3,882,411 | 5/1975 | Ashida et al. | 330/34 |
| 4,188,551 | 2/1980 | Iwaski et al. | 307/311 |
| 4,295,225 | 10/1981 | Pan | 455/601 |

FOREIGN PATENT DOCUMENTS 1050160 12/1966 United Kingdom .
1444951 8/1976 United Kingdom .

Primary Examiner—Stephen C. Buczinski
Assistant Examiner—Linda J. Wallace
Attorney, Agent, or Firm—T. L. Peterson; J. S. Christopher

[57] ABSTRACT

An optical amplifier having, for example, a photocathode to convert light to electrons, an electron multiplier, and a photo-emitter or light emitting diode to convert electrons to light. The electron multiplier may be made of magnesium oxide, silicon dioxide or silicon dioxide having bubbles therein. Alternatively, the electron multiplier may be an avalanche diode or other diode.

12 Claims, 9 Drawing Figures

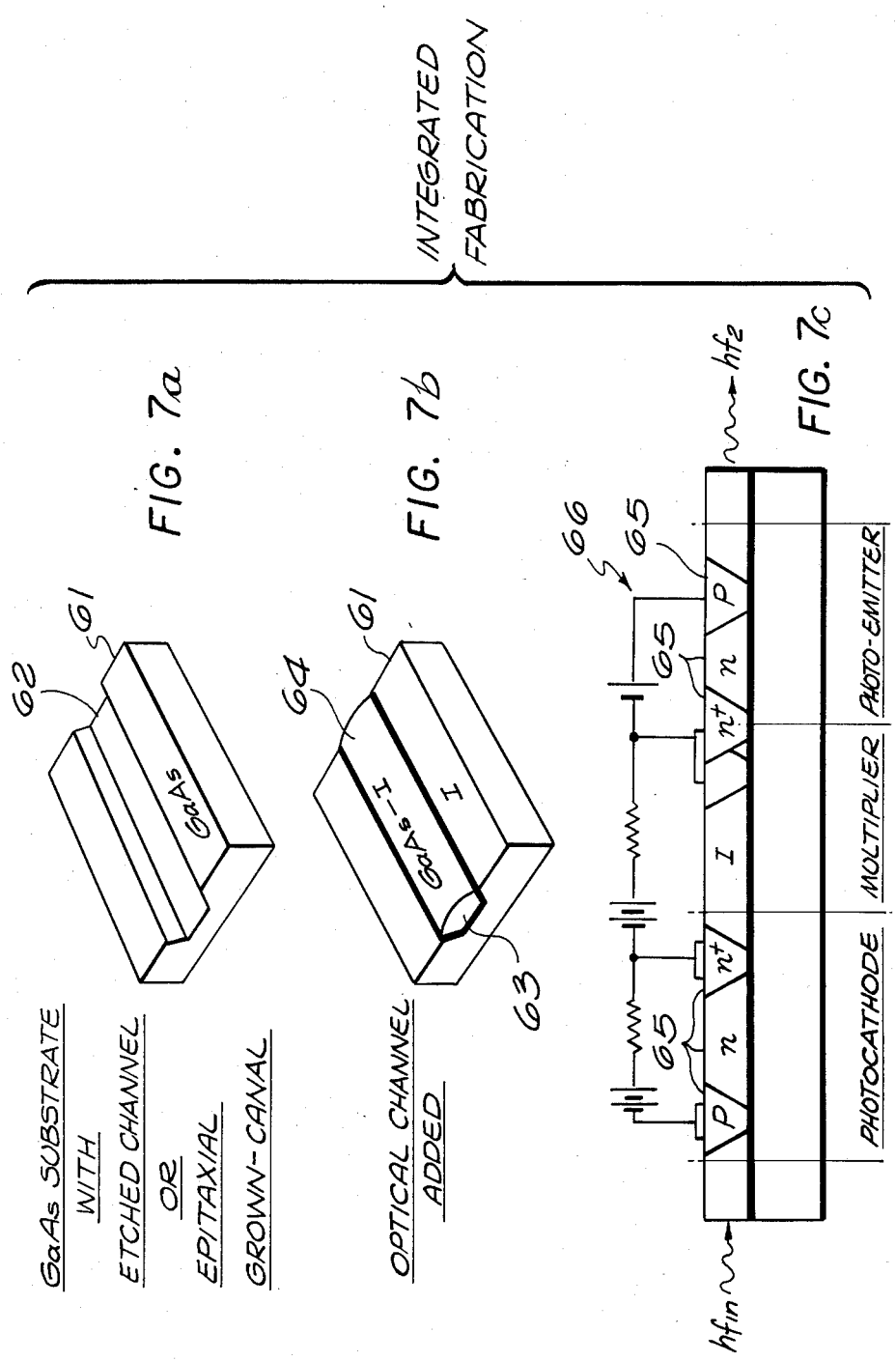

OPTICAL AMPLIFIER

BACKGROUND OF THE INVENTION

This invention relates to optical amplifiers, and more particularly to an optical amplifier for use in the visible and/or invisible light spectrum.

PRIOR ART STATEMENT

It is known in the prior art that a treated hollow glass fiber will support secondary emission when primary electrons are drawn into the interior thereof. A bundle of such fibers is also usable in a high vacuum tube called an image enhancement tube having a photocathode at one end and electroluminescent phosphor at the other.

Further, in current optical amplification systems, the optical (light) signal is converted to electrical energy which is then amplified. After amplification, the resulting electrical signal can then be applied to an optical emitter to regenerate an amplified light beam. The light detector can be a simple photodiode, or it can be combined with a means of amplification such as an avalanche photodiode or electron multiplier. Vacuum tubes, transistors, and integrated circuits are commonly used to amplify the electrical signal. Photo-emissive materials, light emissive diodes and lasers have been used to regenerate optical signals.

Early electron multipliers utilized light-sensitive phosphors and vacuum tube techniques. Although these are still in use, more recent advancements in semiconductor technology have produced the avalanche photodiode which produces signal amplification by means of a photomultiplication process within the semiconductor.

A linear, self-contained direct (light-in/light-out) optical amplifier is not known to be in existence today.

SUMMARY OF THE INVENTION

In accordance with the optical amplifier of the present invention, there is provided a solid electron multiplier which makes light amplification possible without a semiconductive amplifier and with a relatively low voltage.

The foregoing is preferably accomplished by one of the following:

(1) Implanting or doping of various materials into a glass fiber with deposited electrodes for in-line fiber optic light amplification;

(2) A new geometric construction of an avalanche photodiode to exit amplified light;

(3) A microscopic thin-film optical amplifier using deposition techniques as in (1) above.

BRIEF DESCRIPTION OF THE DRAWINGS

In the accompanying drawings which illustrate exemplary embodiments of the present invention:

FIGS. 4, 5, 6, 7a, 7b and 7c are optical amplifiers constructed in accordance with the present invention utilizing a diode electron multiplier.

DESCRIPTION OF THE PREFERRED EMBODIMENT

Figure 1:
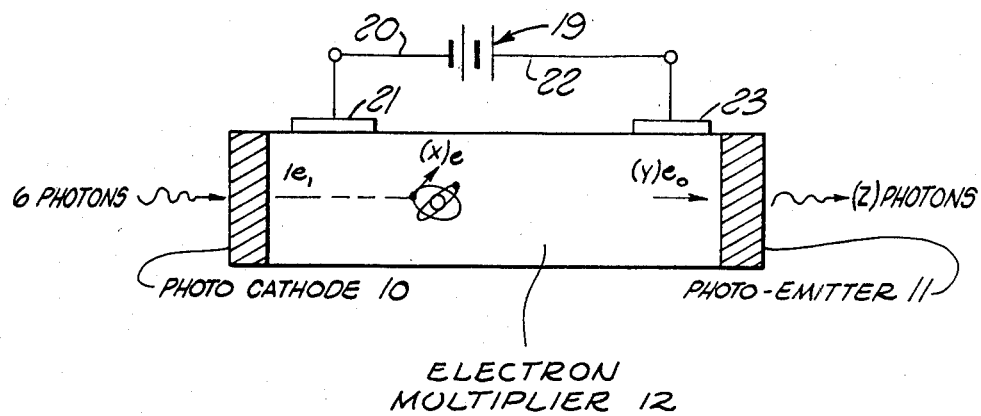
FIG. 1 is a diagrammatic view of a first optical amplifier constructed in accordance with the present invention.

In the drawings in FIG. 1, an electron multiplier 12 made of solid silicon dioxide has a conventional photocathode 10 fixed to one end thereof and a conventional photo-emitter 11 fixed to the other end thereof. A source of potential 19 has a negative pole 20 connected from one electrode 21 and a positive pole 22 connected to another electrode 23. For the electron multiplier 12 of FIG. 1

$Y = X^N$ = Number of electrons entering the photo-emitter 11 where $X$ = average number of electrons dislodged per atomic collision $N$ = number of collisions Example: Let $Y = 10^5$ and $X = 1.1$ eo/el Where $e_o$ equals the average number of output electrons per collision and $e_1$ equals the average number of input electrons per collision.

$Y = X^N$ where Log $Y = N$ Log $X$ $N = \log Y / \log X$ $N = \log (10^5) / \log (1.1 \, eo/el)$ $N = 5/0.0414 = 120.7$ collisions The $SiO_2$ layer is only a thin film.

Figure 2:
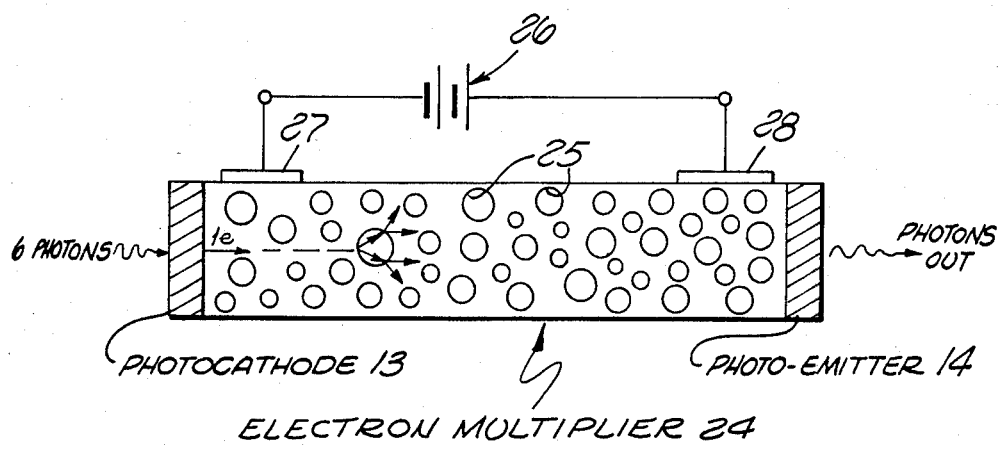
FIG. 2 is a diagrammatic view of a second embodiment of the present invention.

In FIG. 2, a conventional photocathode 13 is provided with a conventional photo-emitter 14. An electron multiplier 24 is provided having a plurality of bubbles 25 or cavities therein. Source 26, electrodes 27 and 28 are provided as before.

The principle of operation of the embodiment of the invention shown in FIG. 2 is as follows. Electron multiplier 24 in FIG. 2 may have a secondary emission ratio greater than that of a solid electron multiplier. Particles of material such as silicon, a nickel alloy or gold that gasify (evaporate) above the melting point of silicon dioxide are first mixed in, and then, as the temperature of the molten silicon dioxide is further raised, they evaporate, providing the plurality of bubbles 25. Cooling at the proper rate does not destroy the plurality of bubbles 25 (this is a conventional procedure). Electrons entering any of the plurality of bubbles 25 carry other electrons with them, and more electrons are set free at the exit. An electron multiplication effect is thereby created.

Figure 3:
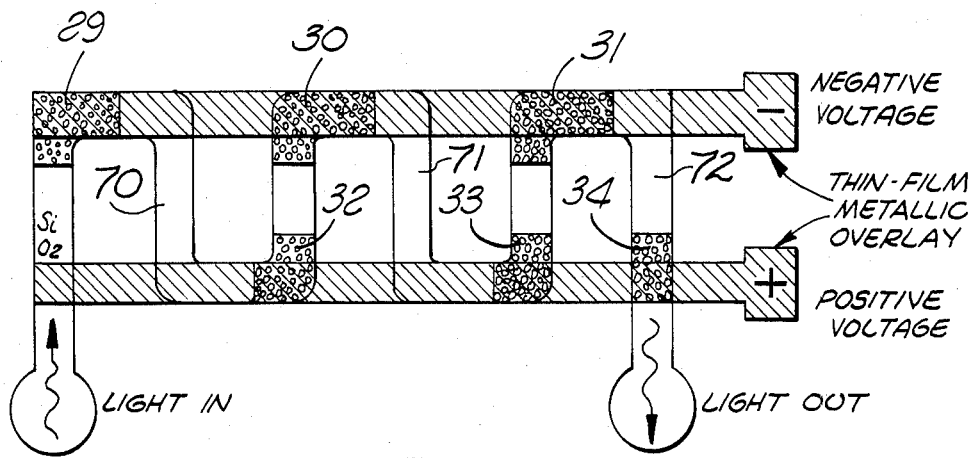
FIG. 3 is a diagrammatic view of a third embodiment of the present invention with optical amplifiers in cascade.

In FIG. 3, cascaded amplifiers are provided including a serpentine structure having a plurality of absorption regions provided at 29, 30 and 31, a plurality of emission regions at 32, 33 and 34 and a plurality of active regions at 70, 71 and 72.

The emission regions 32, 33, 34 of FIG. 3 are similar to the photoemitter 11 of FIG. 1. the "phosphors" utilized in cathoderay tubes phosphoresce to produce non-coherent colors. There is a table of characteristics of various compositions from the ITT Corporation Handbook. For example, the following is conventional:

P2=ZnS:Cu.

In this case, zinc sulphide is the phosphor and copper is a doping impurity, called an activator, that produces multiple levels in the band gap. Indirect recombination of electron-hole pairs in this manner is a slow process, and light emission is sustained for longer periods of time in such a process. Typically, a phosphor would not be used with an activator. Since silicon dioxide ($SiO_2$) is the base material, doping could be done with zinc, magnesium, fluorine, calcium, potassium, cadmium, phosphorous, or beryllium, or some combination thereof in order to form a fluorescent silicate.

Another possibility is to dope with gallium and arsenic to form a GaAs semiconductor which is a coherent photoemitter.

Still another possibility is to start with pure silicon in order to form a silicon semiconductor photoemitter, and then oxidize the center region to form $SiO_2$ (reverse process).

The absorption regions 29, 30, 31 of FIG. 3 are similar to the photocathode 10 of FIG. 1. In the absorption process, a photon of energy exceeding the band gap energy or the molecular lattice frees an electron.

Insulators such as $SiO_2$ have high band gap energies, which is undesirable for use as a photocathode because the light passes directly through the crystal. A known technique is to provide a thin film of metal which is then activated with barium oxide to lower the work function. A barium doping could therefore be used along with a metal such as aluminum or nickel. Cesium, lanthanum, and thorium could also be used as activators for cathodes.

Another possibility is to dope with gallium and arsenic to form a GaAs semiconductor. Since the band gap of this material is 1.4 eV, it is responsive to the near infrared which is a wavelength range commonly used in fiber optics. Other impurities, such as indium and antimony, can be added to improve efficiency.

Pure silicon has a band gap of less than 1.1 eV, which is better than GaAs. Therefore, the reverse of another process could also be used to produce a pure silicon photocathode. Again, dopants such as indium and antimony could be added to improve efficiency.

Figure 4:
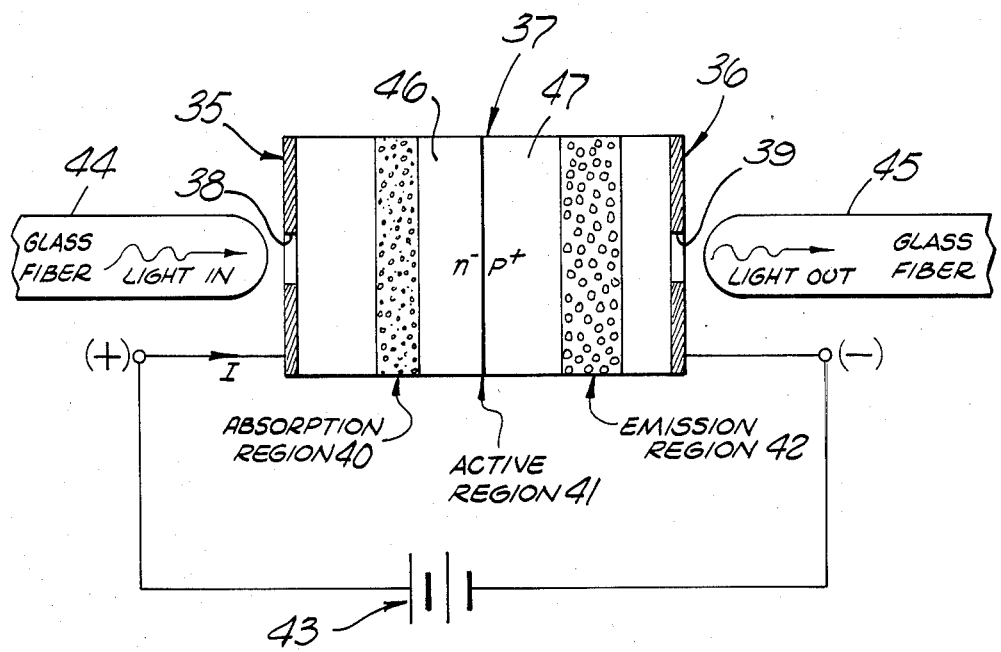

In FIG. 4, metalization is provided at 35 and 36 on opposite ends of a diode 37. Metalizations 35 and 36 have respective holes 38 and 39 therethrough. Absorption, active and emission regions are respectively provided at 40, 41 and 42.

A source of potential 43 is connected between metalizations 35 and 36. Input and output glass fibers are shown at 44 and 45.

Diode 37 has an n-type material at 46 and a p-type at 47.

In FIG. 4, the material is a semiconductor such as silicon or GaAs. The n and p regions are doped with conventional donors and acceptors, respectively. Impurities such as P, As, and S are donors for Si, while B, Al, Ga, and In are acceptors. For GaAs, donor impurities are Te, S, and Se, while zinc is an acceptor. The absorption and emission regions are simply diodes formed in the doping process, with donors in the n region and acceptors in the p region.

APD means "avalanche photodiode." The diode is back-biased at the edge of avalanche. Photons are absorbed, thereby creating free electrons. Due to the high field density, a multiplication effect produces gain.

Figure 5:
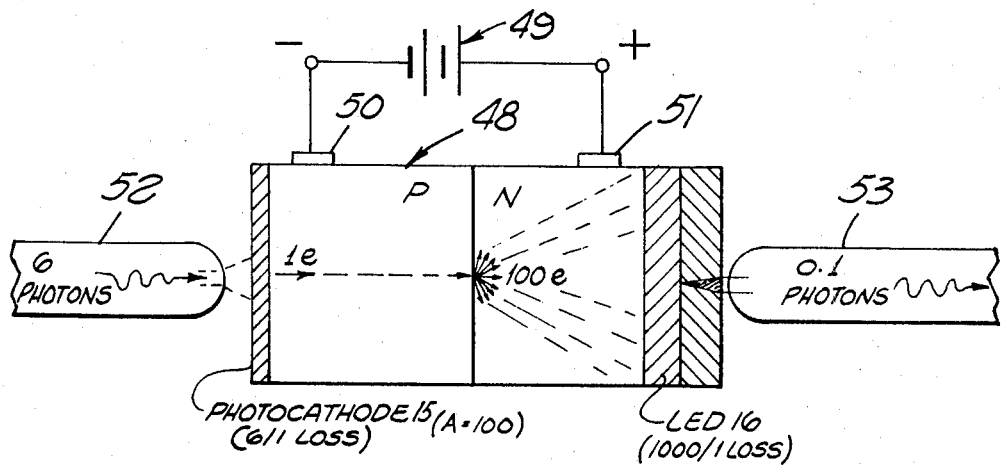

A still further embodiment of the present invention is shown in FIG. 5. In FIG. 5, a conventional photocathode 15 is bonded to one end of a diode 48. The other end of diode 48 has a light emitting diode (LED) 16 fixed relative thereto.

In FIG. 5, a source 49 is connected with electrodes 50 and 51. Glass fibers are provided at 52 and 53.

For the optical amplifier of FIG. 5, the quantum loss at the photocathode 15 is 6/1 where A=100. The loss for LED 16 is 1000/1 where the acceptance angle=29°, 50$\mu$core and NA=0.25 at optimum distance.

Figure 6:
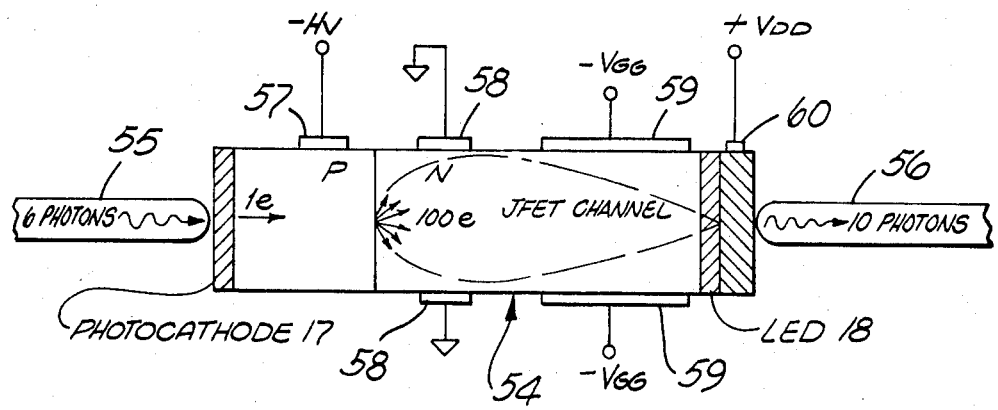

In FIG. 6, a conventional photocathode 17 is provided with a conventional LED 18 and a diode 54. Glass fibers are provided at 55 and 56. Electrodes 57, 58, 59 and 60 are also provided with voltages −HV, ground, −VGG and +$V_{DD}$.

For the optical amplifier of FIG. 6, the loss at the photocathode 17 is 6/1 where A=100. The loss for JFET/LED 18 is 10/1. The gain for the optical amplifier is 1.7. Higher gains can be achieved by cascading stages.

In FIG. 7, a chip 61 of GaAs is etched, and forming a channel groove 62 on optical channel 63 of GaAs with a different index of refraction than that of chip 61 is grown in the channel groove 62 to form an optical waveguide 64. This waveguide 64 is then vertically doped with donors and acceptors as in FIG. 4 to form a plurality of semiconductor regions 65 shown in FIG. 7c. The I region of the PIN (positive-intrinsic-negative) region is intrinsic, or nearly intrinsic material (very lightly doped).

The substrate or chip 61 need not be of GaAs. Any material with a different index of refraction that is compatible with the GaAs process can be used.

In FIG. 7a the intrinsic GaAs substrate (chip 61) has the channel groove 62 etched therein. The optical channel 63 is then added (FIG. 7b). An optical amplifier 66 is then formed as shown in FIG. 7c resulting from the vertical doping.

In FIGS. 1 and 2, all parts are generally cylindrical about the horizontal axis of electron multipliers 12 and 24 in the plane of the paper. The same is true around diodes 37, 48 and 54 in FIGS. 4, 5 and 6, respectively.

SUMMARY

In FIG. 1 and others of FIGS. 2–7c, low-level light enters from the left end of the fiber, and the photons strike the GaAs (or other doping material in the absorption region), thereby freeing electrons which pass into the active region. For instance, an electron colliding with a light-absorption atom can generate a number of additional electrons. These new electrons acquire an initial velocity through conservation of momentum from the impact, and some of the electrons move into the area where an electric field is applied. This field accelerates the electrons in an area that is doped with charge-generating material, such as metallic atoms. Electrons in this area strike these atoms, thereby generating new electrons, creating an avalanche or multiplication effect which serves to amplify the signal. (A technique of this type has been utilized in night-vision goggles in a type of photomultiplier.) The amplified electron stream then passes into the emission region which has been doped with a material such as GaAs, that generates photons upon receiving energy from an electron collision. This, then, regenerates a new optical signal that constitutes the input light signal which has been amplified. It is also possible to combine these dopings into a single area for simplicity, with quantum efficiency being a governing factor.

In FIG. 4, diode 37 is a photodiode and photons permeating the PN junction generate electron-hole pairs within or near the junction. A reverse-bias field sweeps generated carriers across the junction. The APD (avalanche photo detector) contains a multiplication region in which carriers are multiplied by virtue of an avalanche condition that is created by a high-strength field. More advanced forms of the APD have separate absorption and multiplication regions. There is a third region for emission by the regeneration of photons and an additional aperture to exit the amplified light.

For simplification, only three cells are shown in FIG. 3. The cross-section of each serpentine element of FIG. 3 shows no glass fiber but a deposited SiO$_2$, and the structure is no longer in-line but curved into an S-pattern. The serpentine pattern is first deposited with SiO$_2$ (silica), and then the three areas (absorption, active, and emission) are then selectively masked and doped. Semiconductor techniques are utilized to achieve very small size. The absorption regions 29, 30, 31 are at the top with the emission regions 32, 33, 34 at the bottom. The active regions 70, 71, 72 are at three of the six center legs such that a unidirectional electric field is obtained with positive polarity at the bottom. Since physical lengths are microscopic, lower voltages can be used to obtain the necessary high field strength to achieve high multiplication gain in the active region. By employing a larger number of sections in the serpentine, higher gains can be obtained for the light amplifier.

What is claimed is:

1. An optical amplifier comprising:
   a solid body of intrinsic material adapted to produce secondary emission upon electron bombardment thereof;
   a photocathode deposited by doping to a first end of said solid body of intrinsic material;
   a photo-emitter deposited by doping to a second end of said solid body of intrinsic material; and
   means to establish a potential gradient lengthwise across said solid body of intrinsic material between said first end and said second end thereof such that said second end adjacent said photo-emitter is more positive than said first end adjacent said photocathode, said potential gradient means being a voltage source having a negative electrode and a positive electrode, said negative electrode being directly connected to said first end of said solid body of intrinsic material and said positive electrode being directly connected to said second end of said solid body of intrinsic material.

2. The invention as defined in claim 1 wherein said solid body of intrinsic material is comprised entirely of silicon dioxide.

3. An optical amplifier comprising:
   an integrated structural body adapted to provide secondary emission upon electron bombardment thereof;
   a photocathode fixed to a first end of said integrated structural body for absorbing photons of light;
   a photo-emitter fixed to a second end of said integrated structural body for emitting photons of light;
   means for establishing a potential gradient lengthwise across said integrated structural body between said first and said second ends therof such that said second end adjacent to said photo-emitter is more positive than said first end adjacent to said photocathode, said integrated structural body having a plurality of spaced open cavities therein for providing electron multiplication.

4. An optical amplifier comprising:
   an integrated structural body comprised of silicon dioxide adapted to provide secondary emission upon electron bombardment thereof;
   a photocathode fixed to a first end of said integrated structural body for absorbing photons of light;
   a photo-emitter fixed to a second end of said integrated structural body for emitting photons of light; and
   means for establishing a potential gradient lengthwise across said integrated structural body between said first and said second ends thereof such that said second end adjacent to said photo-emitter is more positive than said first end adjacent to said photocathode, said integrated structural body comprised of silicon dioxide having a plurality of spaced open cavities therein for providing electron multiplication wherein said silicon dioxide acts as a conductor.

5. An optical amplifier comprising:
   an optical fiber defining a serpentine path from a first opening to receive light to a second opening from which light may emanate, said path being made of silicon dioxide and having alternately absorption and emission regions, each of said absorption and emission regions having spaced cavities therein, one of said emission regions following each of said absorption regions, and
   means to establish a potential gradient across said path from said first opening to said second opening such that each of said emission regions is more positive than each of the preceding absorption regions.

6. An optical amplifier comprising: an avalanche diode having a first type semiconductor at one end and an opposite type semiconductor at the opposite end; metalization bonded to each of said ends, said metalization having a hole therethrough at each of said ends; an absorption region in said first type semiconductor; an emission region in said opposite type semiconductor; means to admit light through said hole at said one end; means to receive light from the hole at said opposite end; and power supply means to maintain one of said types of semiconductors positive with respect to the other of said semiconductors.

7. The invention as defined in claim 6, wherein said first type of semiconductor is an n-type, and said opposite type is a p-type, said power supply means maintaining said n-type positive with respect to said p-type.

8. The invention as defined in claim 7, wherein said regions each include spaced cavities therein.

9. The invention as defined in claim 6, wherein said first type of semiconductor is a p-type, and said opposite type is an n-type, said power supply means maintaining said n-type positive with respect to said p-type.

10. The invention as defined in claim 9, wherein said regions each include spaced cavities therein.

11. The invention as defined in claim 9, wherein said absorption region includes a photocathode and said emission region includes a light emitting diode (LED), said p-type having a negative high voltage electrode, said n-type having a central ground electrode, said n-type having a negative and positive voltage connection toward said LED.

12. An optical amplifier comprising:
   a gallium arsenide substrate having an elongate etched channel;
   an optical waveguide deposited within said channel for light transmission, said optical waveguide being vertically doped with a plurality of donors and acceptors;
   a semiconductor formed within said channel by the vertical doping of said optical waveguide, said semiconductor being in contact with said substrate; and an avalanche diode formed by the contact of said semiconductor with said substrate, said avalanche diode having an electron emissive section at a light input end, a photo-emissive section at a light output end and a multiplier section therebetween, each of said sections being located in one of a plurality of slots, said electron emissive section including at least a first electron emissive P-N junction and said photo-emissive section including at least a first photo-emissive P-N junction and said multiplier section comprised of an intrinsic layer located between said first electron emissive P-N junction and said first photo-emissive P-N junction for accelerating the electron charges through said avalanche diode.

* * * * *